(12) United States Patent
Kronmueller

(10) Patent No.: US 9,312,828 B2
(45) Date of Patent: Apr. 12, 2016

(54) METHOD AND CIRCUIT FOR CONTROLLED GAIN REDUCTION OF A DIFFERENTIAL PAIR

(71) Applicant: Dialog Semiconductor GmbH, Kirchheim/Teck-Nabern (DE)

(72) Inventor: Frank Kronmueller, Neudenau (DE)

(73) Assignee: Dialog Semiconductor GmbH, Kirchheim/Teck-Nabern (DE)

( * ) Notice: Subject to any disclaimer, the term of this patent is extended or adjusted under 35 U.S.C. 154(b) by 28 days.

(21) Appl. No.: 14/191,629

(22) Filed: Feb. 27, 2014

(65) Prior Publication Data

US 2015/0015331 A1     Jan. 15, 2015

(30) Foreign Application Priority Data

Jul. 10, 2013   (EP) ..................................... 13176002

(51) Int. Cl.
  *H03F 3/45*   (2006.01)
  *H03G 3/30*   (2006.01)
  *G05F 1/575*  (2006.01)
  *H03G 3/00*   (2006.01)
(52) U.S. Cl.
  CPC ............... *H03G 3/30* (2013.01); *G05F 1/575* (2013.01); *H03F 3/45179* (2013.01); *H03G 3/004* (2013.01)
(58) Field of Classification Search
  CPC .................................................. H03G 1/0023
  USPC .................................................. 330/254, 257
  See application file for complete search history.

(56) References Cited

U.S. PATENT DOCUMENTS

| | | | |
|---|---|---|---|
| 5,187,448 A * | 2/1993 | Brooks et al. | 330/258 |
| 6,163,215 A | 12/2000 | Shibata et al. | |
| 2008/0001662 A1* | 1/2008 | Dalena | 330/253 |
| 2012/0280667 A1 | 11/2012 | Drebinger et al. | |

OTHER PUBLICATIONS

Co-pending US Patent DS13-044S, "Method and Circuit for Controlled Gain Reduction of a Gain Stage," by Frank Kronmueller, U.S. Appl. No. 14/191,634, filed Feb. 27, 2014, 34 pgs.
European Search Report 13176002.7-1807 Mailed: Mar. 14, 2014, Dialog Semiconductor GmbH.

* cited by examiner

*Primary Examiner* — Khanh V Nguyen
*Assistant Examiner* — Khiem Nguyen
(74) *Attorney, Agent, or Firm* — Saile Ackerman LLC; Stephen B. Ackerman

(57) ABSTRACT

The present document relates to multi-stage amplifiers, such as linear regulators or linear voltage regulators (e.g. low-dropout regulators) configured to provide a constant output voltage subject to load transients. A multi-stage amplifier is described, having a differential amplification stage which comprises a differential transistor pair. The differential amplification stage is configured to provide a stage output voltage at a stage output node of the differential transistor pair, based on a first input voltage at a first stage input node and a second input voltage at a second stage input node. The differential transistor pair also comprises a reference node. The differential amplification stage further comprises an active load comprising a first diode transistor coupled to the reference node and a first mirror transistor coupled to the stage output node.

19 Claims, 7 Drawing Sheets

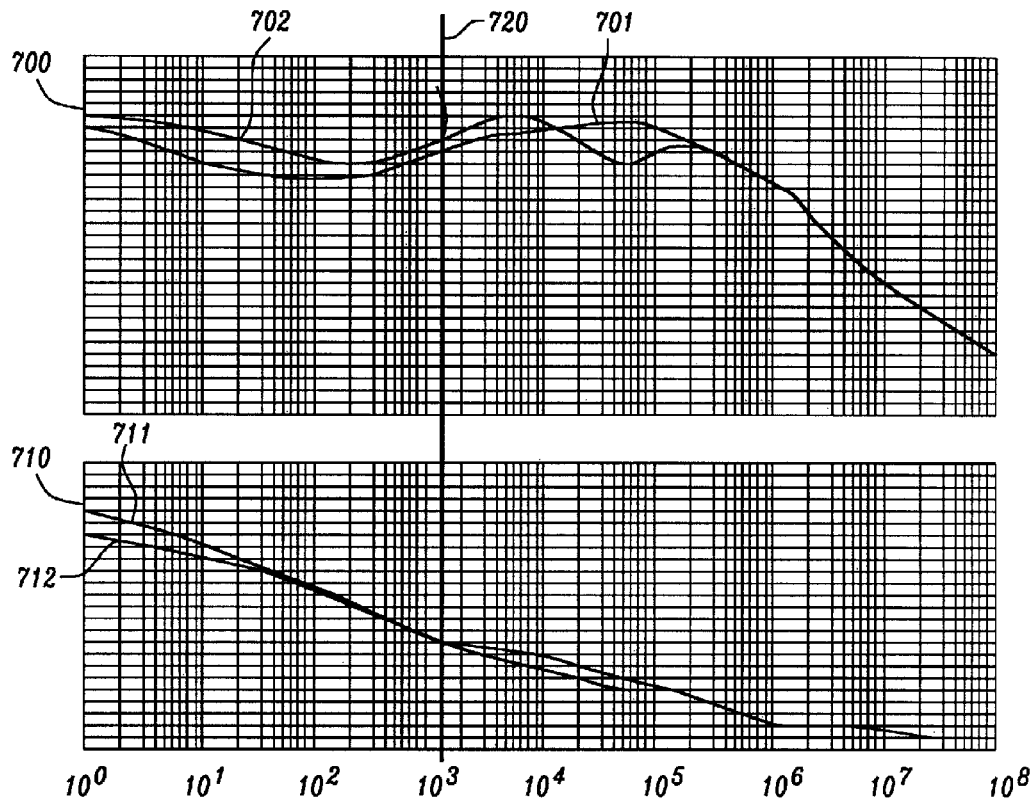

801
Providing a stage output voltage at a stage output node of a differential transistor pair, based on a first input voltage at a first stage input node and a second input voltage at a second stage input node; wherein the differential transistor pair further comprises a reference node

↓

802
Providing an active load for the differential transistor pair, the active load comprising a first diode transistor coupled to the reference node and a first mirror transistor coupled to the stage output node

↓

803
Providing a gain control circuit arranged in parallel to the active load, the gain control circuit comprising a second diode transistor coupled to the stage output node and a second mirror transistor coupled to the reference node

FIG. 8

METHOD AND CIRCUIT FOR CONTROLLED GAIN REDUCTION OF A DIFFERENTIAL PAIR

RELATED PATENT APPLICATION

This application is related to Ser. No. 14/191,634, filed on Feb. 27, 2014, which is assigned to a common assignee, and which is herein incorporated by reference in its entirety.

TECHNICAL FIELD

The present document relates to multi-stage amplifiers, such as linear regulators or linear voltage regulators (e.g. low-dropout regulators) configured to provide a constant output voltage subject to load transients.

BACKGROUND

An example of multi-stage amplifiers are low-dropout (LDO) regulators which are linear voltage regulators which can operate with small input-output differential voltages. A typical LDO regulator 100 is illustrated in FIG. 1a. The LDO regulator 100 comprises an output amplification stage 103, e.g. a field-effect transistor (FET), at the output and a differential amplification stage or differential amplifier 101 (also referred to as error amplifier) at the input. A first input (fb) 107 of the differential amplifier 101 receives a fraction of the output voltage $V_{out}$ determined by the voltage divider 104 comprising resistors R0 and R1. The second input (ref) to the differential amplifier 101 is a stable voltage reference $V_{ref}$ 108 (also referred to as the bandgap reference). If the output voltage $V_{out}$ changes relative to the reference voltage $V_{ref}$, the drive voltage to the output amplification stage, e.g. the power FET, changes by a feedback mechanism called main feedback loop to maintain a constant output voltage $V_{out}$.

The LDO regulator 100 of FIG. 1a further comprises an additional intermediate amplification stage 102 configured to amplify the output voltage of the differential amplification stage 101. As such, an intermediate amplification stage 102 may be used to provide an additional gain within the amplification path. Furthermore, the intermediate amplification stage 102 may provide a phase inversion.

In addition, the LDO regulator 100 may comprise an output capacitance $C_{out}$ (also referred to as output capacitor or stabilization capacitor or bybass capacitor) 105 parallel to the load 106. The output capacitor 105 is used to stabilize the output voltage $V_{out}$ subject to a change of the load 106, in particular subject to a change of the load current $I_{load}$. It should be noted that typically the output current $I_{out}$ at the output of the output amplification stage 103 corresponds to the load current $I_{load}$ through the load 106 of the regulator 100 (apart from typically minor currents through the voltage divider 104 and the output capacitance 105). Consequently, the terms output current $I_{out}$ and load current $I_{load}$ are used synonymously, if not specified otherwise.

Typically, it is desirable to provide a stable output voltage $V_{out}$, even subject to transients of the load 106. By way of example, the regulator 100 may be used to provide a stable output voltage $V_{out}$ to the processor of an electronic device (such as a smartphone). The load current $I_{load}$ may vary significantly between a sleep state and an active state of the processor, thereby varying the load 106 of the regulator 100. In order to ensure a reliable operation of the processor, the output voltage $V_{out}$ should remain stable, even in response to such load transients.

At the same time, the LDO regulator 100 should be able to react rapidly to load transients, i.e. the LDO regulator 100 should be able to rapidly provide the requested load current $I_{load}$, subject to a load transient. This means that the LDO regulator 100 should exhibit a high bandwidth.

The regulator 100 shown in FIG. 1a is an example of a multi-stage amplifier. The present document is directed at providing multi-stage amplifiers which provide an improved trade-off between stability and bandwidth (or response speed), subject to load transients.

SUMMARY

According to an aspect, a multi-stage amplifier, such as a linear regulator, is described. The multi-stage amplifier may comprise a plurality of amplification stages. In particular, the multi-stage amplifier may comprise a first amplification stage configured to provide a stage output voltage at a stage output node. The first amplification stage may comprise or may be a differential amplification stage.

The stage output voltage may be derived by the differential amplification stage based on a first input voltage and based on a second input voltage. The first input voltage may e.g. correspond to a feedback voltage and the second input voltage may e.g. correspond to a reference voltage. The first input voltage may be provided to the differential amplification stage at a first stage input node and the second input voltage may be provided at a second stage input node of the differential amplification stage.

The differential amplification stage may comprise a bias current source configured to provide a bias current, e.g. a constant bias current. The bias current source may be (directly) coupled to a supply voltage of the multi-stage amplifier. Furthermore, the differential amplification stage may comprise a first input transistor and a second input transistor forming a differential transistor pair (also referred to as a differential pair). The first and second input transistors may comprise or may be metal oxide semiconductor (MOS) field effect transistors (FETs), e.g. P-type MOSFETs. Transistor input nodes (e.g. the sources) of the first and second input transistors may be coupled to the bias current source. As such, complementary portions of the bias current may flow through the first and the second input transistors. The transistor output nodes (e.g. the drains) of the first and second input transistors may be coupled with one another via a current mirror (also referred to as an active load of the differential amplification stage or of the differential transistor pair).

A gate of the first input transistor may form the first stage input node for receiving the first input voltage and a gate of the second input transistor may form the second stage input node for receiving the second input voltage. The transistor output node of the second input transistor may form the stage output node of the differential amplification stage. In particular, the point between the transistor output node of the second input transistor and an input of the current mirror may form the stage output node of the differential amplification stage.

The differential transistor pair may further comprise a reference node. The reference node may correspond to the transistor output node (e.g. the drain) of the first input transistor.

The active load of the differential amplification stage may comprise a first diode transistor coupled to the reference node and a first mirror transistor coupled to the stage output node. As indicated above, the active load, in particular the first diode transistor and the first mirror transistor may form a current mirror. The first diode transistor and the first mirror transistor may comprise (or may correspond to) of metal oxide semiconductor field effect transistors (MOSFETs), e.g. N-type MOSFETs.

The multi-stage amplifier may further comprise a gain control circuit arranged in parallel to the active load. The gain control circuit may comprise a second diode transistor coupled to the stage output node and a second mirror transistor coupled to the reference node. The second diode transistor and the second mirror transistor may comprise (or may correspond to) MOSFETs, e.g. N-type MOSFETs. The gain control circuit, in particular the second diode transistor and the second mirror transistor, may form a current mirror. The current mirror of the gain control circuit and the current mirror of the active load may be arranged in an opposed manner with respect to one another. The diode transistors of the gain control circuit and the active load may be transistors for which the transistor output node (e.g. the drain) of the transistor is coupled to the gate of the transistor.

The gates of the first diode transistor and the first mirror transistor may be (directly) coupled with one another. In a similar manner, the gates of the second diode transistor and the second mirror transistor may be (directly) coupled with one another. The gates of the first diode transistor and the first mirror transistor may be (directly) coupled to the reference node. In other words, the gates of the first diode transistor and the first mirror transistor may correspond to the reference node. The gates of the second diode transistor and the second mirror transistor may be (directly) coupled to the stage output node. In other words, the gates of the second diode transistor and the second mirror transistor may correspond to the stage output node.

Furthermore, transistor output nodes (e.g. the drains) of the first diode transistor and of the second mirror transistor may be (directly) coupled with one another. In a similar manner, the transistor output nodes (e.g. the drains) of the second diode transistor and of the first mirror transistor may be (directly) coupled with one another. In particular, the transistor output nodes of the first diode transistor and of the second mirror transistor may be (directly) coupled to the reference node. On the other hand, the transistor output nodes of the second diode transistor and of the first mirror transistor may be (directly) coupled to the stage output node.

The transistor input nodes (e.g. the sources) of the first diode transistor, of the first mirror transistor, of the second diode transistor and of the second mirror transistor may be coupled with one another. In particular, the transistor input nodes of the first diode transistor, of the first mirror transistor, of the second diode transistor and of the second mirror transistor may be coupled to ground.

The gain control circuit may be configured to reduce the gain of the differential amplification stage. By doing this, the stability of the multi-stage amplifier (in particular subject to load transients) may be increased, while at the same time reducing the impact on the bandwidth of the multi-stage amplifier. The gain of the differential amplification stage may depend on the output impedance of the multi-stage amplifier at the stage output node of the differential amplification stage. The output impedance at the stage output node may be dependent on the transconductance $g_m$ of the second diode transistor. As indicated above, the second diode transistor and the second mirror transistor may be implemented as MOSFETs. As such, the second diode transistor may exhibit a diode transistor width-to-length ratio, and the second mirror transistor may exhibit a mirror transistor width-to-length ratio. The output impedance of the multi-stage amplifier at the stage output node may also be dependent on the diode transistor width-to-length ratio and on the mirror transistor width-to-length ratio.

M may define a ratio of the diode transistor width-to-length ratio and the mirror transistor width-to-length ratio. The output impedance of the multi-stage amplifier at the stage output node may notably be dependent on M. In particular, the output impedance Zin of the multi-stage amplifier at the stage output node may be given by $Zin=(1-M)/g_m$.

The inverse of the transconductance $g_m$ of the second diode transistor may be smaller than an output impedance $r_{DS}$ of the first mirror transistor. Alternatively or in addition, the output impedance $Zin=(1-M)/g_m$ may be smaller than the output impedance $r_{DS}$ of the first mirror transistor. By doing this, it may be ensured that the gain control circuit effectively reduces the gain of the differential amplification stage.

The multi-stage amplifier may comprise a second amplification stage. The second amplification stage may also be referred to as an intermediate amplification stage. The second amplification stage may comprise an amplifier current source provides an amplifier current. The amplifier current may be a constant current. The amplifier current source may be directly coupled to the supply voltage of the multi-stage amplifier. Furthermore, the second amplification stage may comprise an amplifier transistor arranged in series with the amplifier current source. As such, some or the entire amplifier current may flow through the amplifier transistor. The amplifier transistor may comprise or may be an N-type MOSFET. A gate of the amplifier transistor may be coupled to the stage output node of the first (i.e. differential) amplification stage. As such, the gate of the amplifier transistor may form a stage input node of the second (i.e. intermediate) amplification stage. A midpoint between the amplifier current source and a transistor output node (e.g. the drain) of the amplifier transistor may form a stage output node of the intermediate amplification stage. The stage output node of the intermediate amplification stage may be coupled e.g. to the stage input node of a further amplification stage of the multi-stage amplifier. The intermediate amplification stage may be configured to provide an amplified or attenuated stage output voltage at the midpoint between the amplifier current source and the amplifier transistor.

The multi-stage amplifier may further comprise an output amplification stage configured to provide a load current at an amplifier output voltage to a load (e.g. a processor of an electronic device). An input of the output amplification stage may be (directly or via further intermediate amplification stages) coupled to the output of the second amplification stage. Furthermore, the multi-stage amplifier may comprise voltage sensing means (e.g. a voltage divider) configured to provide an indication of the amplifier output voltage (also referred to as the feedback voltage). The indication of the amplifier output voltage (i.e. the feedback voltage) may be fed back to an input of the first amplification stage (e.g. as the first input voltage to the first stage input node).

According to a further aspect, a method for stabilizing a multi-stage amplifier is described. In particular, the method may be directed at controlling the gain of a differential amplification stage of the multi-stage amplifier. The method may comprise providing a stage output voltage at the stage output node of a differential transistor pair, based on a first input voltage at a first stage input node and a second input voltage at a second stage input node. The differential transistor pair may further comprise a reference node. Furthermore, the method may comprise providing an active load for or to the differential transistor pair. The active load may comprise a first diode transistor which is (directly) coupled to the reference node and a first mirror transistor which is (directly) coupled to the stage output node. In addition, the method may comprise providing a gain control circuit arranged in parallel to the active load. The gain control circuit may comprise a second diode transistor which is (directly) coupled to the stage output node and a second mirror transistor which is (directly) coupled to the reference node.

According to a further aspect, a software program is described. The software program may be adapted for execution on a processor and for performing the method steps outlined in the present document when carried out on the processor.

According to another aspect, a storage medium is described. The storage medium may comprise a software program adapted for execution on a processor and for performing the method steps outlined in the present document when carried out on the processor.

According to a further aspect, a computer program product is described. The computer program may comprise executable instructions for performing the method steps outlined in the present document when executed on a computer.

It should be noted that the methods and systems including its preferred embodiments as outlined in the present document may be used stand-alone or in combination with the other methods and systems disclosed in this document. In addition, the features outlined in the context of a system are also applicable to a corresponding method. Furthermore, all aspects of the methods and systems outlined in the present document may be arbitrarily combined. In particular, the features of the claims may be combined with one another in an arbitrary manner.

In the present document, the term "couple" or "coupled" refers to elements being in electrical communication with each other, whether directly connected e.g., via wires, or in some other manner.

BRIEF DESCRIPTION OF THE DRAWINGS

The invention is explained below in an exemplary manner with reference to the accompanying drawings, wherein

FIG. 7 show example measurements of a multi-stage amplifier comprising a gain control circuit at the differential amplification stage; and FIG. 8 shows a flow chart of an example method for controlling the gain of a differential amplification stage of a multi-stage amplifier.

DESCRIPTION

Figure 1A:
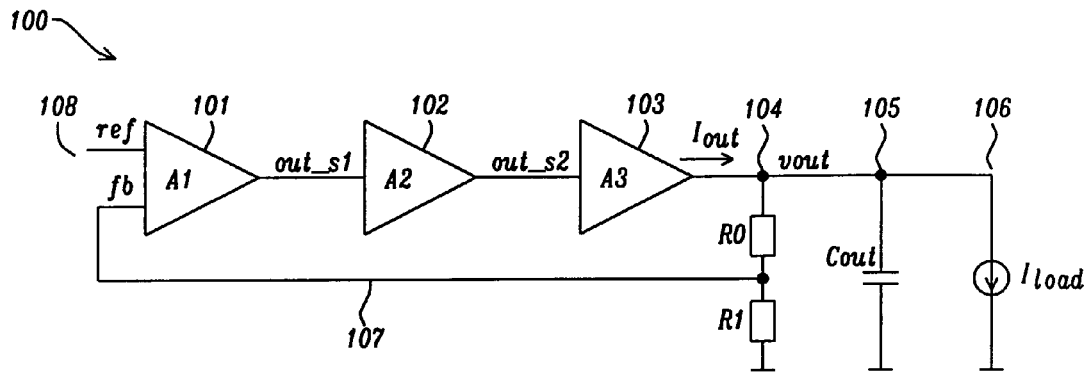
FIG. 1a illustrates an example block diagram of an LDO regulator.
Figure 1B:
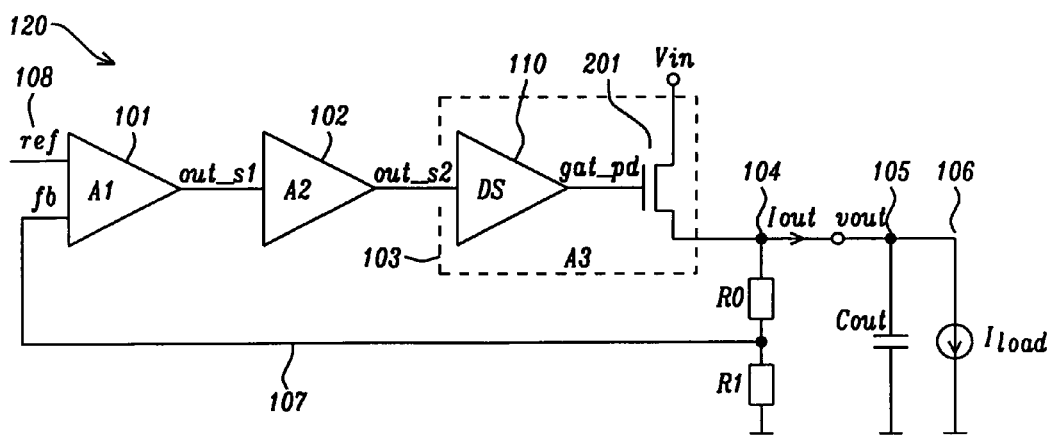
FIG. 1b illustrates the example block diagram of an LDO regulator in more detail.

As already outlined above, FIG. 1a shows an example block diagram for an LDO regulator 100 with its three amplification stages A1, A2, A3 (reference numerals 101, 102, 103, respectively). FIG. 1b illustrates the block diagram of a LDO regulator 120, wherein the output amplification stage A3 (reference numeral 103) is depicted in more detail. In particular, the pass transistor 201 and the driver stage 110 of the output amplification stage 103 are shown. Typical parameters of an LDO regulator are a supply voltage of 3V, an output voltage of 2V, and an output current or load current ranging from 1 mA to 100 or 200 mA. Other configurations are possible. The present invention is described in the context of a linear regulator. It should be noted, however, that the present invention is applicable to multi-state amplifiers in general.

It is desirable to provide a multi-stage amplifier such as the regulator 100, 120, which is configured to generate a stable output voltage $V_{out}$ subject to load transients. The output capacitor 105 may be used to stabilize the output voltage $V_{out}$, because in case of a load transient, an additional load current $I_{load}$ may be provided by the output capacitor 105. Furthermore, schemes such as Miller compensation and/or load current dependent compensation may be used to stabilize the output voltage $V_{out}$.

At the same time, it is desirable to provide a multi-stage amplifier with a high bandwidth. The above stabilization schemes may lead to a reduction of the speed of the multi-stage amplifier. As such, it is desirable to provide a stabilization scheme which has reduced impact on the bandwidth of the multi-stage amplifier.

Figure 2:
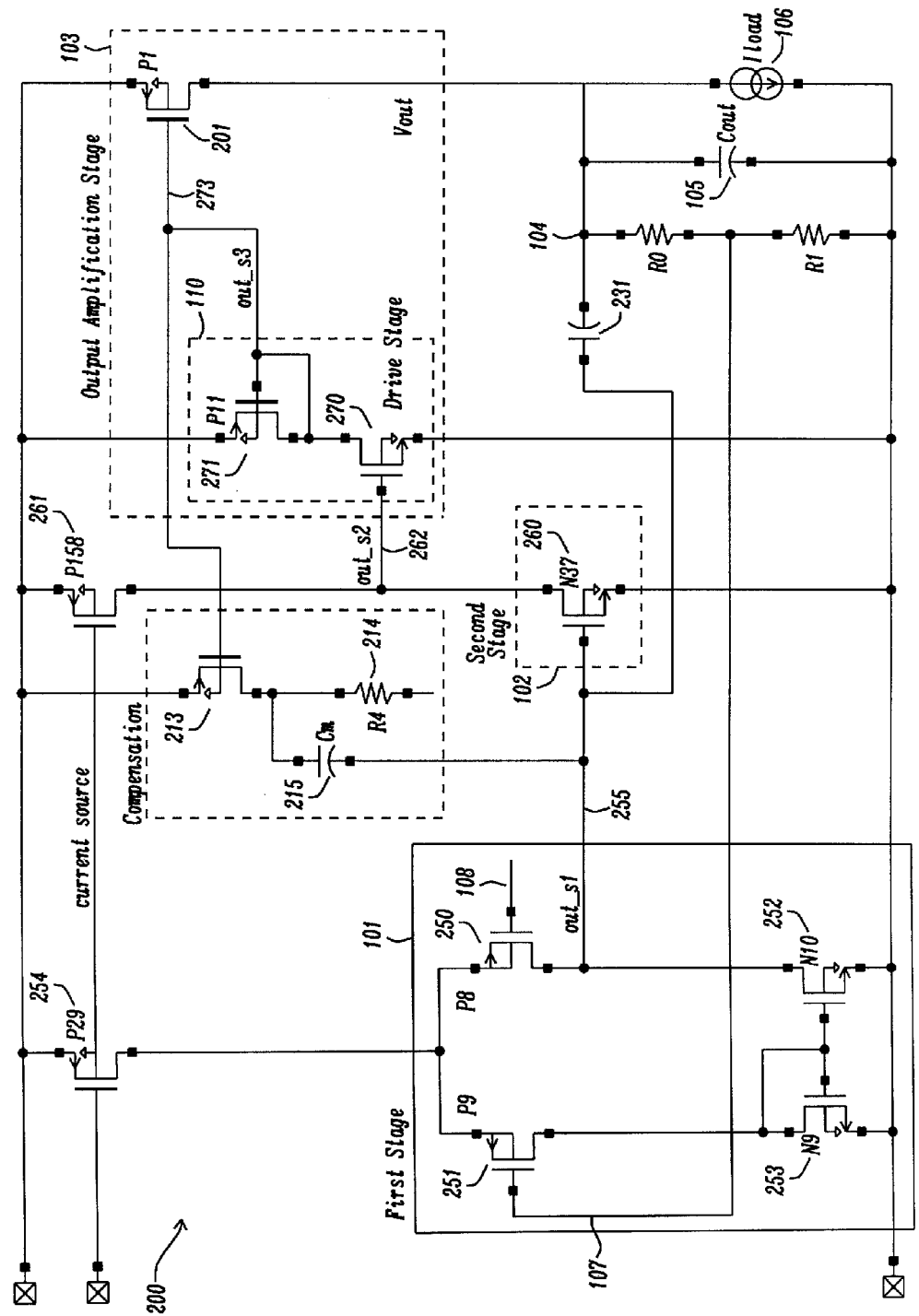
FIG. 2 shows an example circuit arrangement of an LDO regulator.

FIG. 2 illustrates an example circuit arrangement of an LDO regulator 200 comprising a Miller compensation using a capacitance $C_V$ 231 and a load current dependent compensation comprising a current mirror with transistors 201 (corresponding to the pass transistor 201) and 213, a compensation resistor 214 and a compensation capacitance $C_m$ 215.

The circuit implementation of FIG. 2 can be mapped to the block diagrams in FIGS. 1a and 1b, as similar components have received the same reference numerals. In the circuit arrangement 200, the differential amplification stage 101, the intermediate amplification stage 102 and the output amplification stage 103 are implemented using field effect transistors (FET), e.g. metal oxide semiconductor FETs (MOSFETs).

The differential amplification stage 101 comprises the differential input pair of transistors P9 251 and P8 250, and the current mirror N9 253 and N10 252. The input of the differential pair is e.g. a 1.2V reference voltage 108 at P8 and the feedback 107 at P9 which is derived from the resistive divider 104 (with e.g. R0=0.8MΩ and R1=1.2MΩ).

The intermediate amplification stage 102 comprises a transistor N37 260, wherein the gate of transistor N37 260 is coupled to the stage output node 255 of the differential amplification stage 101. The transistor P158 261 acts as a current source for the intermediate amplification stage 102, similar to transistor P29 254 which acts as a current source for the differential amplification stage 101.

The output amplification stage 103 is coupled to the stage output node 262 of the intermediate amplification stage 102 and comprises a pass device or pass transistor 201 and a gate driver stage 110 for the pass device 201, wherein the gate driver stage comprises a transistor 270 and a transistor P11 271 connected as a diode. This gate driver stage has essentially no gain since it is low-ohmic through the transistor diode P11 271 which yields a resistance of $1/g_m$ (output resistance of the driver stage 110 of the output amplification stage 103) to signal ground. The gate of the pass transistor 201 is identified in FIG. 2 with reference numeral 273.

In the present document, means for stabilizing the output voltage of a multi-stage amplifier such as the regulator 200 are described. These means may be used in conjunction with other stabilizing means, such as an output capacitor 105, Miller compensation 231 and/or load current dependent compensation 213, 214, 215. The described stabilizing means are configured to increase the stability of the multi-stage amplifier 200 subject to load transients, and at the same time to allow for a fast convergence of the multi-stage amplifier 200 subject to such load transients.

It has been observed that multi-stage amplifiers 100, 200 may have the potential problem of adding up too much gain under certain operating conditions. The accumulation of substantial gains within the different amplification stages may cause stability problems. In view of this observation, it is proposed in the present document to control the gain of one or more amplification stages of the multi-stage amplifier, and to thereby improve the stability of the multi-stage amplifier 100, 200.

The gain of an amplification stage may be modified using impedance transformation. In particular, a negative feedback may be employed across the amplification stage using resistors to reduce the overall gain.

However, the above mentioned impedance transformation schemes are current consuming, due to the use of low ohmic voltage nodes. In view of this, it is proposed in the present document to use current mode circuits to achieve impedance transformation and to thereby control the gain. Such current mode circuits are advantageous, in view of reduced power losses of the multi-stage amplifier.

As outlined in the context of FIGS. 1a, 1b and 2, a multi-stage amplifier 100, 200 may comprise a plurality of amplification stages 101, 102, 103. The first amplification stage 101 may comprise a differential amplification stage. The first amplification stage 101 may define a low pole, usually with dynamic bias, which changes the bandwidth at the upper and the lower end of the limited dynamic bias. The frequency and gain response of the first amplification stage 101 may be defined by the Miller capacitor 231 compensation.

The second amplification stage 102 may form an intermediate amplification stage. The second amplification stage 102 may have a relatively high bandwidth and a relatively low gain. These characteristics may be critical for stability. As outlined in the context of FIG. 2, the second amplification stage 102 may comprise an amplification transistor 260. The gain of the amplification transistor 260 may be modified by modifying the gate length L of the amplification transistor 260. In particular, by increasing the gate length L of the amplification transistor 260, the transconductance $g_m$ of the amplification transistor 260 may be decreased. Typically, the transconductance $g_m$ of the amplification transistor 260 depends on the ratio of the gate width W and the gate length L, i.e. on W/L. The transconductance $g_m$ of a transistor is typically defined as $g_m = dI_D/dV_{GS}$, wherein $I_D$ is the drain current through the transistor and wherein $V_{GS}$ is the gate-source voltage at the transistor. The transconductance $g_m$ of the amplification transistor 260 usually varies with the drain current $I_D$.

The gain of the second amplification stage 102 typically depends on (e.g. is proportional to) the output impedance $r_{DS}$ of the amplification transistor 260. The output impedance $r_{DS}$ of the amplification transistor 260 may be reduced by reducing the gate length L. Typically, the output impedance $r_{DS}$ is a lon-linear function of the gate length L. The output impedance $r_{DS}$ of a transistor is typically defined as $r_{DS} = dV_{DS}/dI_D$, wherein $I_D$ is the drain current through the transistor and wherein $V_{DS}$ is the drain-source voltage at the transistor. The overall gain which is provided by the amplification transistor 260 (and by the second amplification stage 102) may be given by $g_m * r_{DS} = dV_{DS}/dV_{GS}$. Hence, by reducing the gate length L of the amplification transistor 260 and by reducing the transconducatance $g_m$ the gain of the second amplification stage 102 may be reduced. The overall gain $g_m * r_{DS}$ may be a (non-linear) function of the drain current $I_D$ (e.g. in the range of 15 dB). Hence, a modification of the drain current $I_D$ may be used to modify the overall gain $g_m * r_{DS}$. Furthermore, the bandwidth of the second amplification stage 102 may be a function of (e.g. may be proportional to) the drain current $I_D$.

Typically, the pole of the second amplification stage 102 lies at a frequency beyond the effective gain bandwidth, and therefore the second amplification stage 102 may usually be regarded as being an ideal gain stage.

The third amplification stage 103 may form an output amplification stage of the multi-stage amplifier 100, 200. Typically, the output amplification stage provides current drive capabilities to the output of the multi-stage amplifier 100, 200. The bandwidth of the output amplification stage is typically dependent on the load current $I_{load}$. The gain of the output amplification stage may be determined by the conductance of the input transistor 270, by the mirror ratio between the transistors 271, 201 and/or by the output impedance of the pass device 201.

Multi Stage Amplifiers, especially when used as LDOs, typically have gain variations which depend on the load conditions. These gain variations may cause problems in maintaining stability under various load conditions. In the present document, a gain reduction method and circuit are described. The gain reduction method and circuit may be applied to one or more intermediate stages of a multi-stage amplifier. As a result, the overall stability of the multi-stage amplifier under different load conditions is improved. The described gain reduction method and circuit may be used as an alternative to or in addition to using amplification transistors 260 having a relatively short channel length L for keeping the gain of the amplification stage 102 relatively low. In particular, the gain control circuit may be used to further reduce the gain of the amplification stage 102, once a pre-determined minimal channel length L has be used.

The described gain reduction methods and circuits make use of local current feedback to change the gain of a corresponding intermediate amplification stage 102. The current feedback may be achieved by adding a controlled current source to the intermediate amplification stage 102, which effectively bypasses the amplification transistor 102 which defines the gain of the intermediate amplification stage 102. By doing this, the gain of the intermediate amplification stage 102 may be reduced in a controlled manner.

As outlined above, the bandwidth of an intermediate amplification stage 102 is typically higher than the overall multi-stage amplifier's gain bandwidth. As such, the intermediate amplification stage 102 may be regarded as being an ideal gain stage.

Lowering the gain of the intermediate amplification stage 102 improves stability of the multi-stage amplifier 100, 200 by down shifting the overall system gain. In most cases the down shifting of the overall system gain improves the phase margin of the multi-stage amplifier 100, 200 because the pole defined by the intermediate amplification stage 102 is pushed further below the unity gain.

Figure 3B:
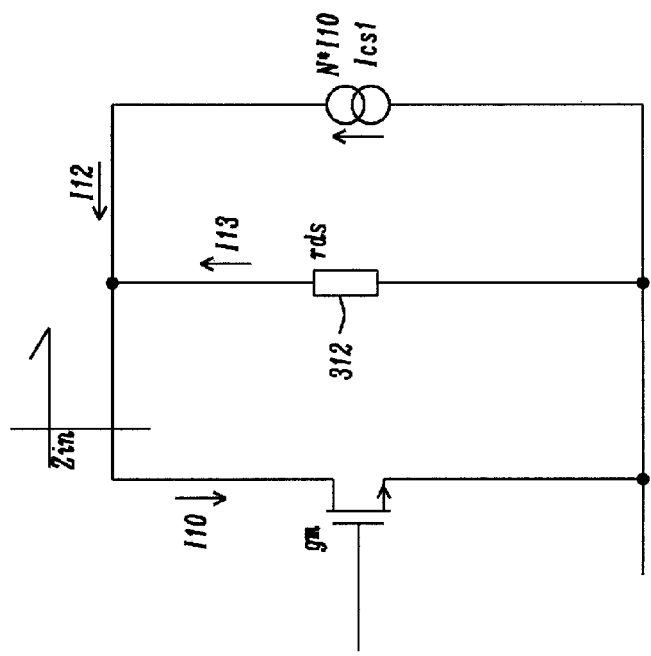
FIGS. 3a and 3b show a circuit diagram of an example gain control circuit configured to control the gain of an intermediate amplification stage.
Figure 3A:
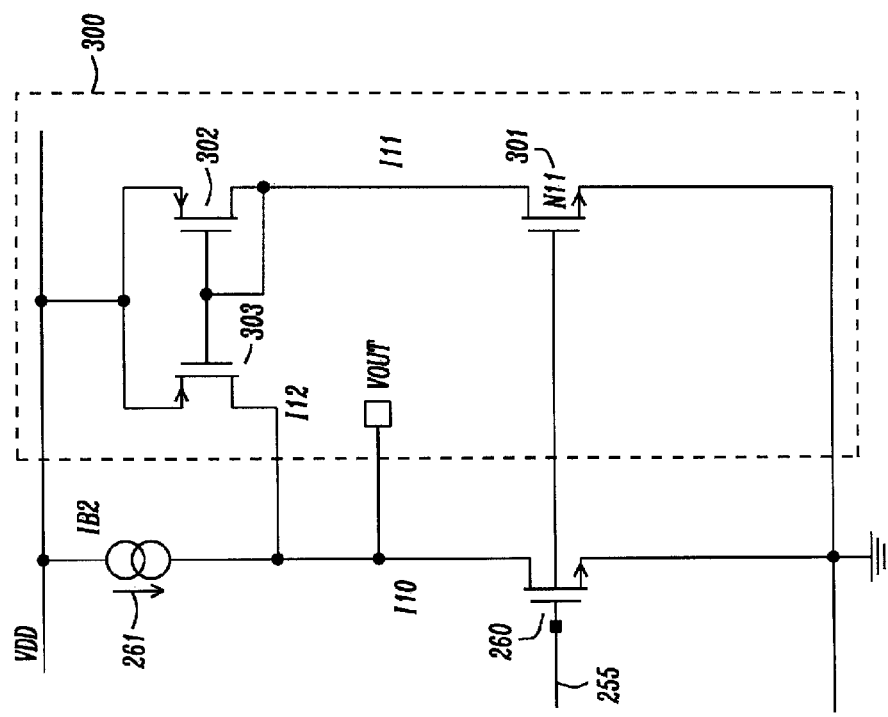

The intermediate amplification stage 102 typically comprises an amplification current source 261 which is arranged in series with the amplification transistor 260 (see FIG. 2 and FIG. 3a). The amplification current source 261 is configured to provide the bias current I10. The amplifier current IB2 provided by the amplification current source 261 is typically fixed. FIG. 3a shows an example gain control circuit 300 which may be used to reduce the gain of the intermediate amplification stage 102. The example gain control circuit 300 comprises a so called current "Miller" circuit, which has been added to reduce the gain of the intermediate amplification stage 102. In particular, the gain control circuit 300 comprises a current mirror comprising the transistor 303 and the diode transistor 302 (which is operated as a diode). The current mirror is configured to transform or mirror the current I11 at the diode transistor 302 into the current I12 at the mirror transistor 303. In the illustrated example, the mirror transistors 303 and the diode transistor 302 comprise or correspond to P-type MOSFETs.

In addition, the gain control circuit 300 comprises a control transistor 301, wherein the gate of the control transistor 301 is coupled to the output 255 of the previous amplification stage 101 (as is the gate of the amplification transistor 260). The current through the control transistor 301 corresponds to the current I11 through the diode transistor 302.

The diode transistor 302 may be referred to as T2 and the mirror transistor 303 may be referred to as T3. In this case, the mirror factor k of the current mirror may be given by $$k = \frac{W_{T2}}{L_{T2}} \frac{L_{T3}}{W_{T3}},$$

wherein $$\frac{W_{T2}}{L_{T2}}$$

is a width to length ratio of the mirror transistor 302 T2 and wherein $$\frac{W_{T3}}{L_{T3}}$$

is a width to length ratio of the diode transistor 303 T3. The current I11 may be given by I12=k*I11. As such, the current I12 may correspond to an amplified or attenuated version of the current I11, wherein the gain/attenuation factor k may depend on the design of the diode transistor 302 and the mirror transistor 303 of the current mirror.

The gain control circuit 300 is configured to reduce the effective current I13 through the output impedance $r_{DS}$ of the amplification transistor 260. Hence less gain is generated by the intermediate amplification stage 102, by using a positive current feedback provided by the gain control circuit 300. The effective current I13 through the amplification transistor 260 may be given by the difference of the current I12 and the current I10 (see FIG. 3b). The current I10 corresponds to the current through the amplification transistor 260 without the gain control circuit 300. This current I10 would lead to a full gain at the $r_{DS}$ of the amplification transistor 260. The gain control circuit 300 provides the current I12, which reduces the actual current I13 through the amplification transistor 260, thereby reducing the gain of the second amplification stage 102.

The FIG. 3b shows an equivalent circuit diagram for the second amplification stage 102. It can be seen that the impedance Zin of the amplification stage 102 may be described by Zin=rds*(1−N), wherein rds 312 (or $r_{DS}$) is the output resistance of the amplification transistor 260 and wherein the gain adjustment value N is defined by the ratio of the control transistor 301 over the amplification transistor 260 and by the ratio of the mirror transistor 303 and the diode transistor 302 of the gain control circuit 300. In particular, the gain adjustment value N may be given by the ratio of the control transistor 301 and the amplification transistor 260 (e.g. $(W_c/L_c)/(W_d/L_d)$, with $W_c/L_c$ being the width/length ratio of the control transistor 301 and with $W_d/L_d$ being the width/length ratio of the amplification transistor 260) multiplied by the ratio of the mirror transistor 303 and the diode transistor 302 (e.g. $(W_{T3}/L_{T3})/(W_{T2}/L_{T2})$, with $W_{T3}/L_{T3}$ being the width/length ratio of the mirror transistor 303 and with $W_{T2}/L_{T2}$ being the width/length ratio of the diode transistor 302). Typically the gain adjustment value N is in the range of zero to one, e.g. 0<N<1.

FIG. 3a shows an example of an intermediate amplification stage 102 which comprises an N-type MOSFET amplification transistor 260. It should be noted that a gain control circuit 300 may also be used in conjunction with a P-type MOSFET amplification transistor.

Figure 4A:
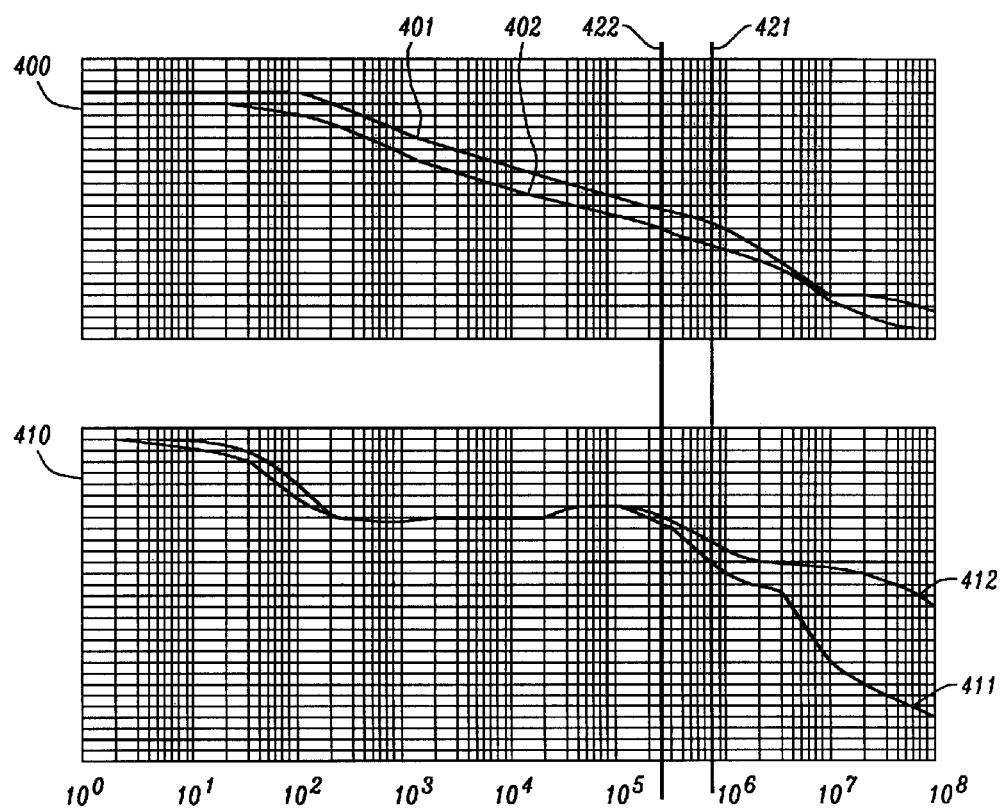
FIGS. 4a and 4b show example measurements of a multi-stage amplifier comprising a gain control circuit.

FIG. 4a shows experimental measurement results for an intermediate amplification stage 102 which comprises a gain control circuit 300 (curves 402, 412) and for an intermediate amplification stage 102 which does not comprise a gain control circuit 300 (curves 401, 411). It can be seen that when using the gain control circuit 300, the loop gain 400 of the multi-stage amplifier 100, 200 is reduced (from curve 401 to curve 402). On the other hand, it can be seen that the phase margin 410 is increased when using the gain control circuit 300. In particular, it can be seen that for a loop gain 400 of 0 dB (which occurs at frequency 422 when using a gain control circuit 300, and at frequency 421 when not using the gain control circuit 300), the phase margin 410 is at −19 degrees (when not using the gain control circuit 300) and at +30 degrees (when using the gain control circuit 300). Hence, the stability of the multi-stage amplifier is increased, when using the gain control circuit 300.

Figure 4B:
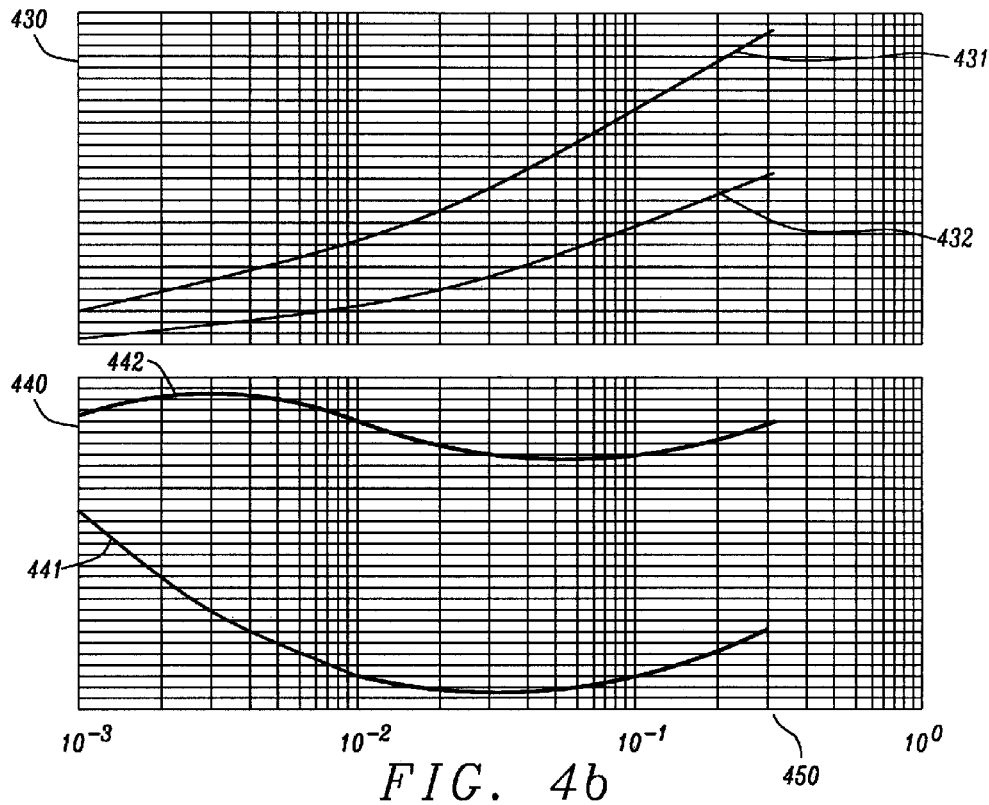

In FIG. 4b, the gain bandwidth (GBW) 430 and the phase margin (PM) 440 of a multi-stage amplifier 100, 200 is plotted versus a load current $I_{load}$ 450 of the multi-stage amplifier 100, 200. It can be seen that the gain bandwidth 430 is lower, when using a gain control circuit 300 (curve 432) compared to a situation, where no gain control circuit 300 is used (curve 431). On the other hand, it can be seen that when using the gain control circuit 300 (curve 442), the phase margin 440 is higher than when not using the gain control circuit 300 (curve 441). This effect is achieved over varying load currents 450. The improved phase margin 440 may be used to achieve a larger design space, which would otherwise lead to an increased need for circuit components and/or current.

Figure 5:
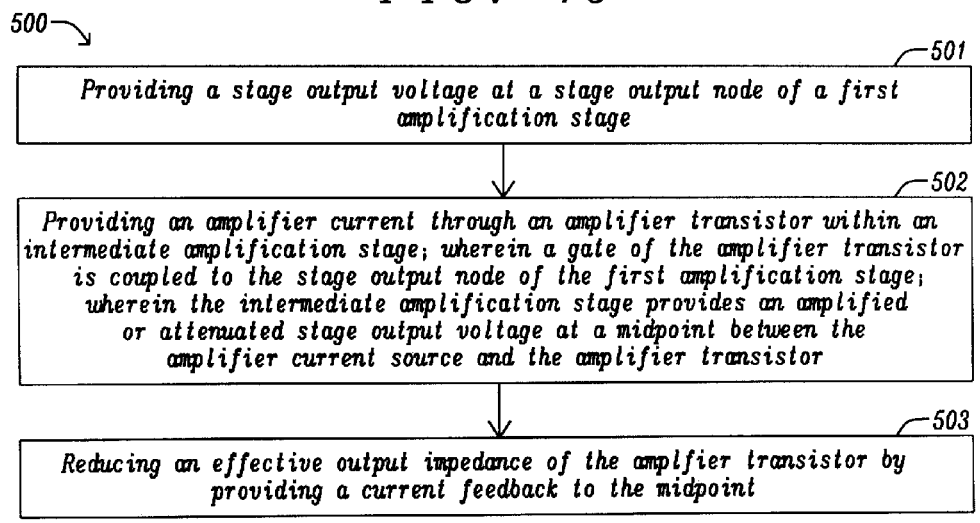
FIG. 5 shows a flow chart of an example method for controlling the gain of an intermediate amplification stage of a multi-stage amplifier.

FIG. 5 shows a flow chart of an example method 500 for stabilizing a multi-stage amplifier 100, 200. The method 500 comprises the step of providing 501 a stage output voltage at a stage output node 255 of the first amplification stage 101. Furthermore, the method 500 comprises the step of providing 502 an amplifier current IB2 through the amplifier transistor 260 within the intermediate amplification stage 102. The gate of the amplifier transistor 260 is typically coupled to the stage output node 255 of the first amplification stage 101. The intermediate amplification stage 102 may be configured to provide an amplified or attenuated stage output voltage at the midpoint 262 between the amplifier current source 261 and the amplifier transistor 260. The midpoint 262 typically corresponds to the stage output node of the intermediate amplification stage 102. Furthermore, the method 500 comprises the step of reducing 503 an effective output impedance of the amplifier transistor 260 by providing a current feedback to the midpoint 262. This may be achieved by using a gain control circuit 300 as described in the context of FIG. 3a.

Figure 6:
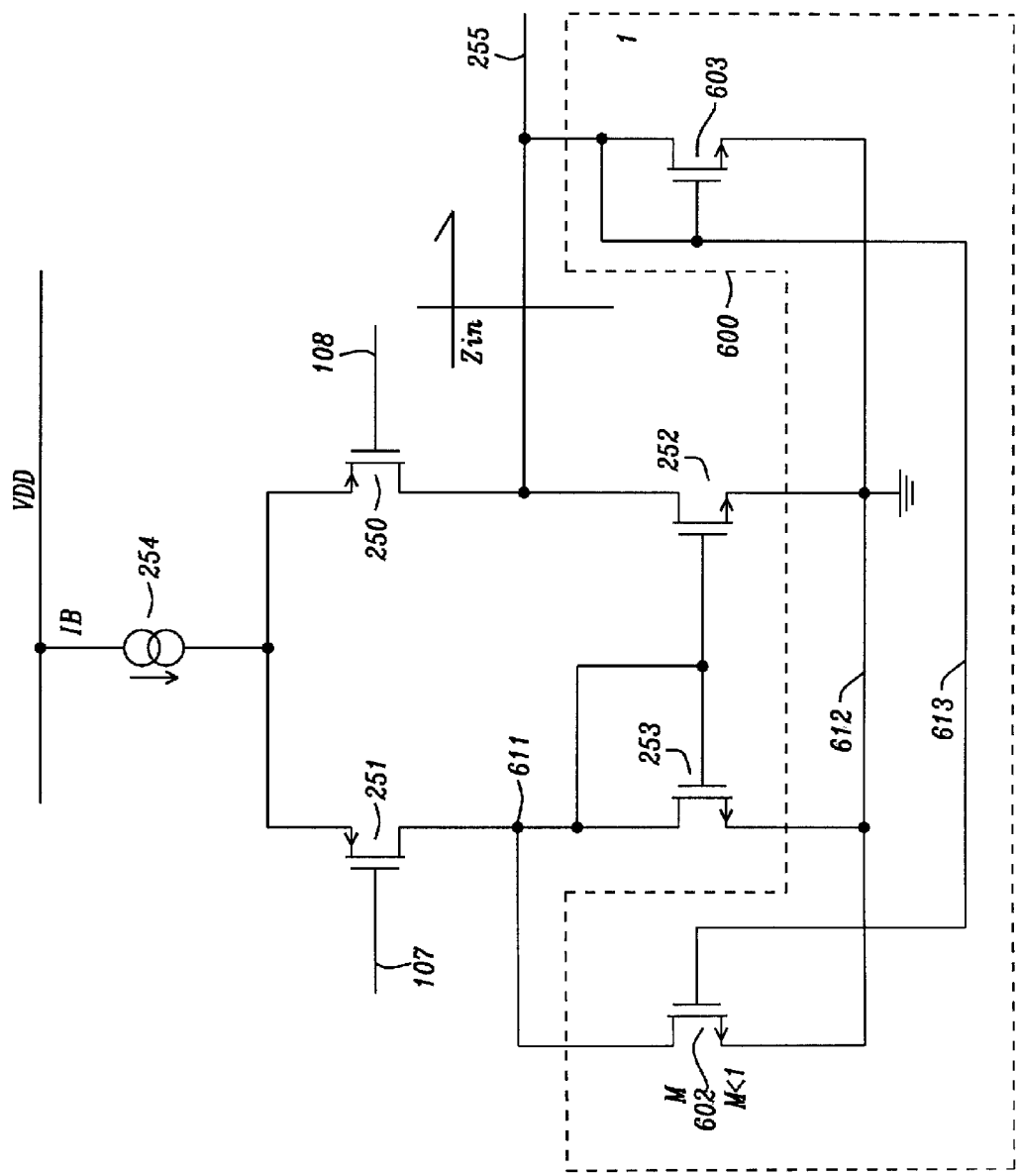
FIG. 6 shows a circuit diagram of an example gain control circuit configured to control the gain of a differential amplification stage.

FIG. 6 shows a circuit diagram of an example gain control circuit 600 which may be used in conjunction with the differential amplification stage 101, in order to reduce the overall gain of the multi-stage amplifier 100, 200 and in order to increase the stability of the multi-stage amplifier 100, 200. The gain control circuit 600 may be used alternatively or in addition to the gain control circuit 300 shown in FIG. 3a.

The gain control circuit 600 makes use of local current feedback to modify the gain of the differential pair gain stage 251, 250 with an active load 253, 252. This may be achieved by adding a reduced impedance element at the output 255 of the differential amplification stage 101. The impedance of the reduced impedance element may then be increased in a controlled manner using feedback in order to achieve the overall gain reduction.

Usually the gain of a differential pair of transistors 251, 250 with an active load 253, 252 may dependent on the tail (bias) current IB provided by the current source 254 of the differential amplification stage 101. In particular, the bandwidth of the differential amplification stage 101 may depend on the bias current. A reduction of the bias current IB may lead to an increase of the gain of the differential amplification stage 101. In particular, the variation (e.g. reduction) of the bias current IB may move the transistors 251, 250 into weak inversion which provides approximately 10-20 dB more gain compared to the operation in strong inversion. This is typically due to a nonlinear behaviour of the transconductance $g_m$ and the output impedance $r_{DS}$ of the transistors 251, 250.

As illustrated in FIG. 6, a gain control circuit 600 may be added in parallel to the active load 253, 252 of the differential pair 251, 250. The gain control circuit 600 may be used to reduce the gain of the differential amplification stage 101 which depends on the bias current IB. In particular, the gain control circuit 600 may be used to reduce or limit the gain of the differential amplification stage 101, even when the bias current IB is reduced. Even more particularly, the $r_{DS}$ of the differential amplification stage 101 (e.g. of the mirror transistor 252 of the active load) may be limited by the gain control circuit 600.

The gain control circuit 600 comprises a diode load 603 (also referred to as diode transistor) and a matched current mirror 602 (also referred to as mirror transistor) which are added to the output of the differential pair 251, 250 (in parallel to the active load 253, 252). The gates 613 of the diode transistor 603 and of the mirror transistor 602 may be directly coupled. Furthermore, the sources 612 of the diode transistor 603 and of the mirror transistor 602 may be directly coupled. The drain of the diode transistor 603 may be coupled to the stage output node 255 of the differential amplification stage 101 (and to the drain of the mirror transistor 252 of the active load of the differential amplification stage 101). The drain of the mirror transistor 602 may be coupled to the drain 611 of the diode transistor 253 of the active load of the differential amplification stage 101.

A low impedance seen by the differential pair may be increased using feedback to the other branch of the differential pair. Usually the transconductance $g_m$ of the diode transistor 253 of the active load is significantly smaller than the output impedance $r_{DS}$ of the mirror transistor 252 of the active load, if the current density is the same. Current feedback provided by the gain control circuit 600 may be used to increase the effective impedance seen by the differential pair. In particular, a current may be provided at the drain of the mirror transistor 602. This current is added to the current provided at the drain of the transistor 251 of the differential pair. Assuming the current through the diode transistor 253 of the active load to remain unchanged, the current provided at the drain of the transistor 251 decreases, thereby increasing the effective impedance seen by the differential pair.

The feedback ratio M of the gain control circuit 600 may be smaller than one. In case of a feedback ratio M being smaller than one (0<M<1), the gain control circuit 600 may be used to stabilize the multi-stage amplifier. In particular, the gain control circuit 600 may affect the gain of the differential amplification stage 101, when the direct diode load current and the bias current are in the same range.

The feedback ratio M typically depends on (or corresponds to) the mirror factor k of the current mirror given by the diode transistor N4 602 and the mirror transistor N3 303. The mirror factor k of the current mirror may be given by $$k = \frac{W_{N4}}{L_{N4}} \frac{L_{N3}}{W_{N3}},$$

wherein $$\frac{W_{N4}}{L_{N4}}$$

is a width to length ratio of the mirror transistor 602 N4 and wherein $$\frac{W_{N3}}{L_{N3}}$$

is a width to length ratio of the diode transistor 603 N3. The drain current at the mirror transistor N4 302 may be given by k times the drain current at the diode transistor N3 303.

The effective impedance may be chosen to be smaller than the $r_{DS}$ of the mirror transistor 252, in order to achieve the desired effect of reducing the gain in case of reduced bias currents IB provided by the bias current source 254. In other words, the effective impedance Zin of the differential amplification stage 101 comprising the gain control circuit 600 may be selected to be smaller than the $r_{DS}$ of the mirror transistor 252 (which corresponds to the impedance Zin at the stage output node 255 of the differential amplification stage 101 without the gain control circuit 600.

It should be noted that if the bias current IB becomes 3-4 times larger than the input current I3 (i.e. the drain current into the diode transistor 603 of the gain control circuit 600, then the gain control circuit 600 may not be effective, since the $r_{DS}$ of the active load mirror transistor 252 becomes lower than the effective $g_m$ of the gain control circuit 600. In such case, the effect of the gain control circuit 600 (caused by the drain current I3) may become negligible. A variable bias current IB which is provided by a controllable current source 254 may be used to selectively control this effect.

The impedance Zin at the stage output node 255 of the differential amplification stage 101 may be described as Zin= $(1-M)/g_m$, wherein $g_m$ is the transconductance of the diode transistor 603 of the gain control circuit 600. Consequently, by appropriately selecting the mirror ratio M of the current mirror formed by the diode transistor 603 and the mirror transistor 602 of the gain control circuit 600, i.e. by appropriately designing the diode transistor 603 and the mirror transistor 602, the impedance Zin of the differential amplification stage 101, and by consequence, the gain of the differential amplification stage 101, may be adapted. In particular, by increasing the mirror ratio M (towards a value of 1), the gain of the differential amplification stage 101 may be reduced.

FIG. 7 shows measurement results for a multi-stage amplifier 100, 200 comprising a differential amplification stage 101 which makes use of the gain control circuit 600. In particular, the phase margin 700 and the loop gain 710 of the multi-stage amplifier 100, 200 are illustrated as a function of frequency. It can be seen that for a particular frequency 720, the gain is reduced (curve 712) compared to the gain which is obtained without using the gain control circuit (curve 711). At the same time, the phase margin is increased, when using the gain control circuit (curve 702 compared to curve 701). In particular, the low end gain is reduced and the pole is shifted out, when using the gain control circuit 600. This helps increasing the phase margin. As a result, the minimum phase margin is also increased, thereby reducing the risk to a potential instability of the multi-stage amplifier.

FIG. 8 shows a flow diagram of an example method 800 for controlling the gain of the differential amplification stage 101 of a multi-stage amplifier 100, 200. The method 800 comprises the step of providing 801 a stage output voltage at the stage output node 255 of a differential transistor pair 251, 250, based on the first input voltage 107 at the first stage input node and based on the second input voltage 108 at the second stage input node of the differential amplification stage 101. The first and second stage input nodes of the differential amplification stage 101 may correspond to the gates of the transistors 251, 250 of the differential transistor pair. The differential transistor pair 251, 250 may further comprise a reference node 611.

The method 800 may further comprise providing 802 an active load 253, 252 for the differential transistor pair 251, 250. The active load 253, 252 may comprise a first diode transistor 253 coupled to the reference node 611 and a first mirror transistor 252 coupled to the stage output node 255 of the differential amplification stage 101. In addition, the method 800 may comprise providing 803 a gain control circuit 600 arranged in parallel to the active load 253, 252. The gain control circuit 600 may comprise a second diode transistor 603 coupled to the stage output node 255 and a second mirror transistor 602 coupled to the reference node 611.

In the present disclosure, gain control circuits and a corresponding methods have been described, which are configured to increase the stability of a multi-stage amplifier for various frequencies and/or for various load currents, while at the same time limiting the reduction of the gain bandwidth of the multi-stage amplifier. In other words, the present document describes means for providing an improved tradeoff between the stability and the bandwidth of a multi-stage amplifier.

It should be noted that the description and drawings merely illustrate the principles of the proposed methods and systems. Those skilled in the art will be able to implement various arrangements that, although not explicitly described or shown herein, embody the principles of the invention and are included within its spirit and scope. Furthermore, all examples and embodiment outlined in the present document are principally intended expressly to be only for explanatory purposes to help the reader in understanding the principles of the proposed methods and systems. Furthermore, all statements herein providing principles, aspects, and embodiments of the invention, as well as specific examples thereof, are intended to encompass equivalents thereof.

What is claimed is:

1. A multi-stage amplifier comprising
a differential amplification stage comprising a differential transistor pair, and configured to provide a stage output voltage at a stage output node of the differential transistor pair, based on a first input voltage at a first stage input node and a second input voltage at a second stage input node wherein the differential transistor pair further comprises a reference node wherein the differential amplification stage further comprises an active load comprising a first diode transistor coupled to the reference node and a first mirror transistor coupled to the stage output node;
a gain control circuit arranged in parallel to the active load, the gain control circuit comprising a second diode transistor coupled to the stage output node; and a second mirror transistor coupled to the reference node;
a second amplification stage comprising an amplifier current source configured to provide an amplifier current; and an amplifier transistor arranged in series with the amplifier current source wherein a gate of the amplifier transistor is coupled to the stage output node of the differential amplification stage;
an output amplification stage configured to provide a load current at an amplifier output voltage to a load; wherein an input of the output amplification stage is coupled to an output of the second amplification stage; and
voltage sensing means configured to provide an indication of the amplifier output voltage wherein the indication of the amplifier output voltage is fed back as the first input voltage to the first stage input node.

2. The multi-stage amplifier of claim 1, wherein the active load and the gain control circuit form respective current mirrors.

3. The multi-stage amplifier of claim 1, wherein
a gate of the first diode transistor and a gate of the first mirror transistor are coupled with one another;
a gate of the second diode transistor and a gate of the second mirror transistor are coupled with one another;
transistor output nodes of the first diode transistor and of the second mirror transistor are coupled with one another;
transistor output nodes of the second diode transistor and of the first mirror transistor are coupled with one another; and
transistor input nodes of the first diode transistor, the first mirror transistor, the second diode transistor and the second mirror transistor are coupled with one another.

4. The multi-stage amplifier of claim 3, wherein
the gate of the first diode transistor and the gate of the first mirror transistor are coupled to the reference node;
the gate of the second diode transistor and the gate of the second mirror transistor are coupled to the stage output node;
the transistor output nodes of the first diode transistor and of the second mirror transistor are coupled to the reference node;
the transistor output nodes of the second diode transistor and of the first mirror transistor are coupled to the stage output node; and
the transistor input nodes of the first diode transistor, the first mirror transistor, the second diode transistor and the second mirror transistor are coupled to ground.

5. The multi-stage amplifier of claim 1, wherein an output impedance of the multi-stage amplifier at the stage output node is dependent on a transconductance $g_m$ of the second diode transistor.

6. The multi-stage amplifier of claim 5, wherein
the second diode transistor exhibits a diode transistor width-to-length ratio;
the second mirror transistor exhibits a mirror transistor width-to-length ratio; and
the output impedance of the multi-stage amplifier at the stage output node is dependent on the diode transistor width-to-length ratio and on the mirror transistor width-to-length ratio.

7. The multi-stage amplifier of claim 6, wherein
M is a ratio of the diode transistor width-to-length ratio and the mirror transistor width-to-length ratio; and
the output impedance of the multi-stage amplifier at the stage output node is dependent on M.

8. The multi-stage amplifier of claim 1, wherein
the differential amplification stage comprises a bias current source configured to provide a bias current;
the differential transistor pair comprises a first input transistor and a second input transistor;
transistor input nodes of the first and second input transistors are coupled to the bias current source;
a gate of the first input transistor forms the first stage input node for receiving the first input voltage;
a gate of the second input transistor forms the second stage input node for receiving the second input voltage;
a transistor output node of the second input transistor forms the stage output node; and
a transistor output node of the first input transistor forms the reference node.

9. The multi-stage amplifier of claim 8, wherein the bias current is a constant current.

10. The multi-stage amplifier of claim 1, wherein an inverse of a transconductance $g_m$ of the second diode transistor is smaller than an output impedance $r_{DS}$ of the first mirror transistor.

11. The multi-stage amplifier of claim 1, wherein a transistor output node of a diode transistor is coupled to a gate of the diode transistor.

12. A method for controlling the gain of a differential amplification stage of a multi-stage amplifier, the method comprising
providing a stage output voltage at a stage output node of a differential transistor pair, based on a first input voltage at a first stage input node and a second input voltage at a second stage input node; wherein the differential transistor pair further comprises a reference node;
providing an active load for the differential transistor pair, the active load comprising a first diode transistor coupled to the reference node and a first mirror transistor coupled to the stage output node;
providing a gain control circuit arranged in parallel to the active load, the gain control circuit comprising a second diode transistor coupled to the stage output node and a second mirror transistor coupled to the reference node;
providing a second amplification stage comprising an amplifier current source configured to provide an amplifier current; and an amplifier transistor arranged in series with the amplifier current source; wherein a gate of the amplifier transistor is coupled to the stage output node of the differential amplification stage;
providing an output amplification stage configured to provide a load current at an amplifier output voltage to a load; wherein an input of the output amplification stage is coupled to an output of the second amplification stage; and
providing voltage sensing means configured to provide an indication of the amplifier output voltage; wherein the indication of the amplifier output voltage is fed back as the first input voltage to the first stage input node.

13. The method of claim 12 wherein said second amplification stage comprises an N-type MOSFET amplification transistor.

14. The method of claim 12 wherein said second amplification stage comprises a P-type MOSFET amplification transistor.

15. The method of claim 12 wherein multi-stage amplifier comprises an output capacitor.

16. The method of claim 15 wherein said output capacitor is a stabilization capacitor.

17. The method of claim 15 wherein said output capacitor is a bypass capacitor.

18. The method of claim 12 wherein said differential pair transistors are metal oxide semiconductor field effect transistors (MOSFETs).

19. The method of claim 18 wherein said MOSFETs are p-channel MOSFETs.

* * * * *